United States Patent
Sakaguchi et al.

(10) Patent No.: US 11,789,101 B2
(45) Date of Patent: Oct. 17, 2023

(54) MAGNETIC RESONANCE IMAGING APPARATUS AND METHOD OF COMPENSATING FOR ERROR MAGNETIC FIELD

(71) Applicant: HITACHI, LTD., Tokyo (JP)

(72) Inventors: Naoya Sakaguchi, Tokyo (JP); Syouichi Miyawaki, Tokyo (JP); Hirokazu Honma, Tokyo (JP)

(73) Assignee: FUJIFILM HEALTHCARE CORPORATION, Chiba (JP)

( * ) Notice: Subject to any disclaimer, the term of this patent is extended or adjusted under 35 U.S.C. 154(b) by 309 days.

(21) Appl. No.: 16/784,354

(22) Filed: Feb. 7, 2020

(65) Prior Publication Data

US 2020/0333411 A1 Oct. 22, 2020

(30) Foreign Application Priority Data

Apr. 19, 2019 (JP) .................. 2019-080182

(51) Int. Cl.
*G01R 33/3875* (2006.01)
*G01R 33/54* (2006.01)
(Continued)

(52) U.S. Cl.
CPC ..... *G01R 33/3875* (2013.01); *G01R 33/3852* (2013.01); *G01R 33/543* (2013.01); *G01R 33/56518* (2013.01); *G01R 33/56563* (2013.01)

(58) Field of Classification Search
CPC ............ G01R 33/3875; G01R 33/3852; G01R 33/543; G01R 33/56518; G01R 33/56563
See application file for complete search history.

(56) References Cited

U.S. PATENT DOCUMENTS

2008/0088307 A1* 4/2008 Dewdney ........... G01R 33/3875
324/309
2012/0098535 A1 4/2012 Kaneta et al.
(Continued)

FOREIGN PATENT DOCUMENTS

JP 2008-022877 A 2/2008
JP 2012-245350 A 12/2012
(Continued)

OTHER PUBLICATIONS

Notice of Reasons for Refusal, dated Dec. 27, 2022, for Japanese Application No. 2019-080182 (with English translation).

*Primary Examiner* — Rishi R Patel
(74) *Attorney, Agent, or Firm* — Baker Botts L.L.P.

(57) ABSTRACT

Provided are MRI images with excellent image quality and in which the occurrence of artifacts is suppressed by effectively removing a secondary error magnetic field, generated by compensation current (additional current), of eddy current that is caused by applying a gradient magnetic field. The present invention measures and analyzes, in advance, a secondary error magnetic field generated due to the applying of compensation current and saves the results as compensation parameters (secondary compensation parameters), uses the secondary compensation parameters to calculate a correction magnetic field output to be applied to each of a gradient magnetic field coil and a correction coil, and supplies this correction magnetic field output to the gradient magnetic field coil and the correction coil to compensate for (cancel out) the secondary error magnetic field.

12 Claims, 15 Drawing Sheets

(51) Int. Cl.
*G01R 33/385* (2006.01)
*G01R 33/565* (2006.01)

(56) References Cited

U.S. PATENT DOCUMENTS

| | | |
|---|---|---|
| 2014/0218031 A1 | 8/2014 | Lee et al. |
| 2016/0274202 A1* | 9/2016 | Stemmer .......... G01R 33/56563 |
| 2017/0168128 A1* | 6/2017 | Feiweier .............. G01R 33/443 |

FOREIGN PATENT DOCUMENTS

| | | |
|---|---|---|
| WO | WO 2004/004563 A1 | 1/2004 |
| WO | WO 2010/143586 A1 | 12/2010 |
| WO | WO 2012/026382 A1 | 3/2012 |

* cited by examiner (A) STEP RESPONSE (B) OUTPUT OF THE CORRECTION MAGNETIC FIELD
FOR PRIMARY ERROR MAGNETIC FIELD (C) OUTPUT THE CORRECTION MAGNETIC FIELD
FOR SECONDARY ERROR MAGNETIC FIELD

MAGNETIC RESONANCE IMAGING APPARATUS AND METHOD OF COMPENSATING FOR ERROR MAGNETIC FIELD

INCORPORATION BY REFERENCE

The present application claims priority from Japanese patent application JP-2019-80182 filed on Apr. 19, 2019, the content of which is hereby incorporated by reference into this application.

BACKGROUND OF THE INVENTION

1. Field of the Invention

This invention relates to a magnetic resonance imaging apparatus (hereinafter referred to as "MRI" apparatus), and particularly relates to a technique of compensating for a secondary error magnetic field caused by applying compensation current of an error magnetic field that is the result of applying a gradient magnetic field.

2. Description of the Related Art

MRI apparatuses apply high frequency magnetic fields to a subject placed in a uniform static magnetic field to cause nuclear magnetic resonance in nuclei (protons) present in a desired region of the subject. MRI apparatuses obtain cross-sectional images of that region from nuclear magnetic resonance signals (or echo signals) generated by the nuclear magnetic resonance. At this time, the high frequency magnetic field and a gradient magnetic field are applied in order to selectively excite a specific region, and an axis of application and intensity of the gradient magnetic field are controlled in order to provide spatial position information to the measured echo signals. Since the gradient magnetic field is applied as a pulse, eddy currents are induced at the rise and fall of the gradient magnetic field (when the magnetic field changes) in conductive structures disposed near a gradient magnetic field coil. This eddy current creates a new magnetic field. This magnetic field is an error magnetic field of the intended gradient magnetic field and causes artifacts such as distortion to occur in images.

In order to prevent the image quality degradation caused by such error magnetic fields, WO 2010-143586 A, for example, discloses a technique of measuring, in advance, the error magnetic field induced by eddy current, modeling, and outputting, to the gradient magnetic field coil, compensation current that cancels the error magnetic field, thereby reducing the image quality degradation. In this technique, the error magnetic field that is generated in the same direction as the gradient magnetic field and, also, the error magnetic field in the direction orthogonal to the gradient magnetic field (cross term) are detected, and compensation current that cancels out the axial direction and cross term error magnetic fields is output to the gradient magnetic field coil of each axis.

In MRI apparatuses, the static magnetic field space in which the subject is placed must have high magnetic field uniformity. This magnetic field uniformity is unattainable with static magnetic field magnets alone. As such, such high magnetic field uniformity is achieved by constantly supplying shim current to a shim coil (correction coil) to generate a correction magnetic field. In some cases, the gradient magnetic field coil described above also serves as the correction coil, but the other shim coils are disposed near the gradient magnetic field coil. Consequently, eddy current caused by the pulsed application of the gradient magnetic field is generated in the shim coils and additional current must be superimposed to cancel that eddy current.

Furthermore, when compensating for the error magnetic field that is generated when imaging in the gradient magnetic field coil, the shim coils or the like due to the additional current (the compensation current) being superimposed, a secondary error magnetic field is generated due to the superimposed additional current. However, with conventional techniques, there are instances in which this secondary error magnetic field cannot be sufficiently compensated for, and the secondary error magnetic field causes the image quality degradation.

SUMMARY OF THE INVENTION

As such, an object of the present invention is to provide MRI images with excellent image quality and in which the occurrence of artifacts is suppressed by effectively removing a secondary error magnetic field, generated by compensation current (additional current), of eddy current that is caused by applying a gradient magnetic field.

The present invention measures and analyzes, in advance, a secondary error magnetic field generated due to the applying of compensation current and saves the results as compensation parameters (secondary compensation parameters), uses the secondary compensation parameters to calculate a correction magnetic field output to be applied to each of a gradient magnetic field coil and a correction coil, and supplies this correction magnetic field output to the gradient magnetic field coil and the correction coil to compensate for (cancel out) the secondary error magnetic field.

Specifically, a magnetic resonance imaging apparatus of the present invention includes a static magnetic field magnet that generates a static magnetic field; a transmitter/receiver that irradiates a high frequency magnetic field on a subject that is placed in the static magnetic field, and collects nuclear magnetic resonance signals generated from the subject; a gradient magnetic field coil that adds a gradient magnetic field to the static magnetic field; a correction coil that corrects non-uniformity of the static magnetic field; a measurement control unit that controls the transmitter/receiver, the gradient magnetic field coil, and the correction coil; and a calculation unit that performs calculations related to imaging. The calculation unit includes a compensation parameter calculation unit that uses a measurement value of an error magnetic field generated as a result of applying a test gradient magnetic field of one or a plurality of axes to calculate compensation parameters for a secondary error magnetic field caused by a correction magnetic field output for a primary error magnetic field of a gradient magnetic field pulse of each axis. The measurement control unit includes a correction magnetic field output calculation unit that uses the compensation parameters for the secondary error magnetic field to calculate an correction magnetic field output, and supplies the correction magnetic field output to at least one of the gradient magnetic field coil and the correction coil.

According to the present invention, compensation current is calculated from the compensation parameters for an error magnetic field measured in advance for each of the gradient magnetic field coil and the correction coil, and the compensation current is supplied to each coil. As a result, image degradation can be prevented when secondary error magnetic fields are generated.

DETAILED DESCRIPTION OF THE INVENTION

Figure 1:
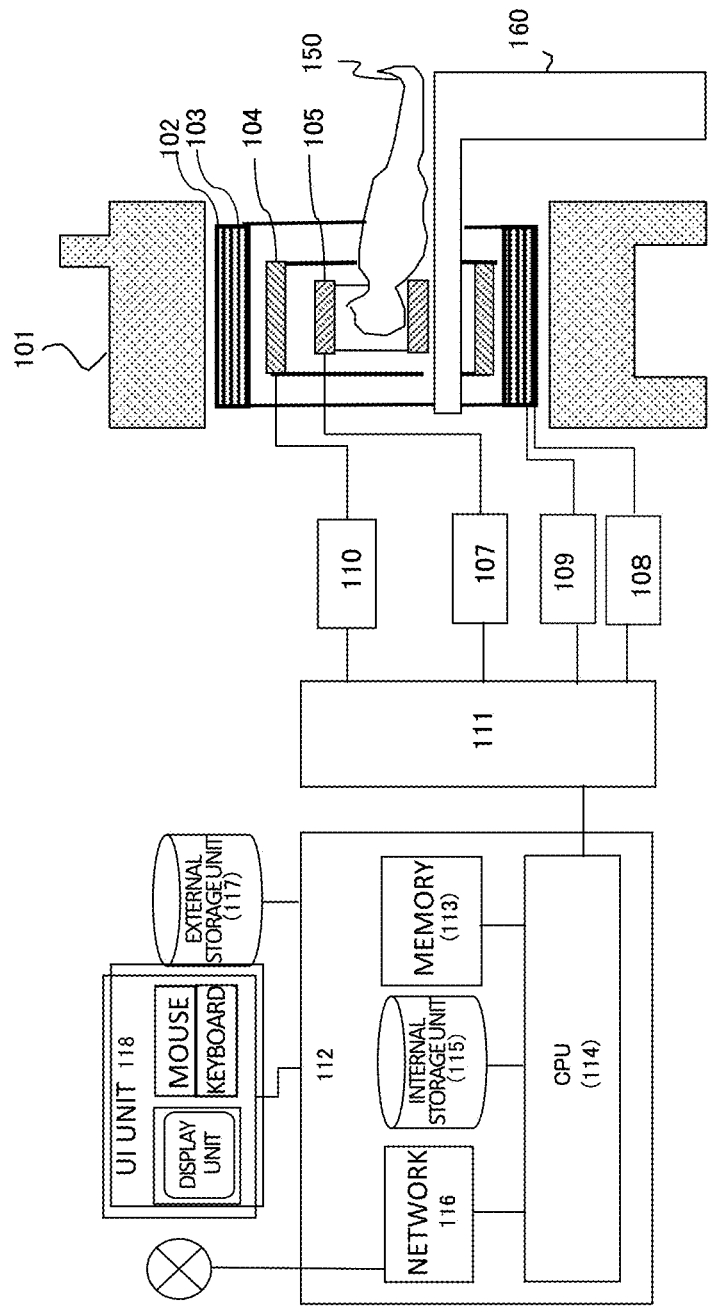
FIG. 1 is a drawing illustrating the overall configuration of an MRI apparatus to which the present invention is applied.

First, a summary of an MRI apparatus to which the present invention is applied will be described. As illustrated in FIG. 1, an MRI apparatus 100 includes, as an imaging device, a static magnetic field generating magnet 101, a shim coil 102 that is disposed in a static magnetic field space generated by the static magnetic field generating magnet 101 and is for correcting non-uniformities of a static magnetic field, a gradient magnetic field coil 103 that provides the static magnetic field with a gradient magnetic field, an RF transmitting coil 104 that irradiates a high frequency magnetic field on a subject 150 that is in the static magnetic field space, an RF receiving coil 105 that receives nuclear magnetic resonance signals emitted from the subject 150, an RF transmitting unit 106 that supplies high frequency pulsed current to the RF transmitting coil 104, a signal processing unit 107 that detects an NMR signal received by the RF receiving coil 104 and performs signal processing, a shim power supply 108 and a gradient magnetic field power supply 109 that respectively supply current to the shim coil 102 and the gradient magnetic field coil 103, and a measurement control unit 110 that controls the operations of the RF transmitting unit 106, the signal processing unit 107, and the gradient magnetic field power supply 109. The subject 150 lays on a table 160 and, in this state, is arranged in the static magnetic field space generated by the static magnetic field generating magnet 101.

The MRI apparatus includes, as a control and calculation system, a computer 111 that includes a CPU 114, a memory 113, an internal storage unit 115, and the like, an external storage device 117 that is connected to the computer 111, and a user interface unit (UI) 118 that includes a display device, an input device, and the like. The computer 111 may be connected to an external network such as the internet, and an intranet via a network IF 116.

The static magnetic field generating magnet 101 includes a permanent magnet-type, a normal conduction-type, or a super conducting-type static magnetic field source. The type of static magnetic field generating magnet depends on the direction in which the static magnetic field is generated such as a vertical magnetic field type, and a horizontal magnetic field type. The present invention can be applied to any type of static magnetic field generating magnet.

The shim coil 102 consists of one to a plurality of correction coils that apply zero-ary (zero-order) to multi-ary (multi-order) correction magnetic fields to the static magnetic field (Bo). The shim power supply 108 constantly supplies current to generate correction magnetic fields from the correction coils, thereby maintaining the uniformity of the static magnetic field to an order of 0.1 ppm, for example. For the primary (linear) correction magnetic field, the gradient magnetic field coil (described later) may serve as the correction coil and generate the correction magnetic field.

The gradient magnetic field coil 103 consists of coils that are wound in three axial directions respectively, namely the X, Y, and Z axial directions, which constitute the real space coordinate system (coordinate system at rest) of the MRI apparatus. A gradient magnetic field pulse can be applied in a desired direction as a result of the gradient magnetic field power supply 109 supplying pulsed current to each gradient magnetic field coil. Position information is added to the NMR signal as a result of the gradient magnetic field being applied. Specifically, when, for example, imaging a two-dimensional cross-section (slice), the slice position is determined by applying the gradient magnetic field in the slice direction. While the slice position is excited, one of the two directions orthogonal to the slice surface is set as a phase encoding direction, the other direction is set as a read direction, and a gradient magnetic field pulse is applied in each direction. As a result, the generated NMR signal can be encoded in each direction. The NMR signal is typically collected as an echo signal of the RF pulse or the gradient magnetic field pulse. As such, in the following, the NMR signal is also referred to as an echo signal.

The high frequency pulsed current is supplied from the RF transmitting unit 106. As a result, the RF transmitting coil 104 generates a pulsed induction magnetic field (RF pulse) Due to this, the nuclei (protons, for example) of the atoms constituting the tissue of the subject 150 are excited and generate an NMR signal. The RF receiving coil 105 detects the echo signal from the subject 150, and sends the detected echo signal to the signal processing unit 107. The signal processing unit 107 performs quadrature detection on the echo signal and converts the echo signal from analog to digital, sets the results as time-series digital data (hereinafter referred to as "echo data"), and performs various processes necessary for image reconstruction.

The intensities and timings of the RF pulse and the gradient magnetic field pulse of each axis, the timing of signal collection (sampling), and the like are predetermined as a pulse sequence for each imaging, and are set in the measurement control unit 110. The pulse sequence to be used in the imaging is calculated using the pulse sequence set in the measurement control unit 110 and imaging parameters set by a user via the UI unit 118. The RF transmitting unit 106, the gradient magnetic field power supply 109, and the signal processing unit 107 are controlled in accordance with this imaging sequence. Thus, it is possible to collect echo data, from the subject 150, that is necessary for image reconstruction.

The computer 111 functions as a total control unit that controls the entire apparatus including the imaging device and the measurement control unit 110. In addition, the computer 111 functions as a calculation unit that performs various calculations using the processing results of the signal processing unit 107 and the like. Data, partially processed data, and the like necessary for the processing of the computer 111 are stored in the memory 113 and/or the internal storage unit 115. Processing results, namely images, calculation results, and the like, can be displayed on a display of the UI unit 118, saved in the external storage device 117, transferred via a network, or the like. In addition to the settings of the imaging parameters, a user can use the UI unit 118 to send commands and instructions needed for the processing of the computer 111.

In addition to the basic configuration described above, the MRI apparatus of the present invention includes, as a function of the measurement control unit 110 and the computer 111, which control the shim power supply 108 and the gradient magnetic field power supply 109, a function for controlling the error magnetic fields, particularly the secondary error magnetic field, caused by the generation of eddy current that results from the application of the gradient magnetic field pulse.

Next, a specific embodiment of means for eliminating the secondary error magnetic field is described.

Embodiment 1

In the present embodiment, the measurement control unit 110 performs control to measure the error magnetic field that is secondarily generated (secondary error magnetic field), under conditions in which correction magnetic field output is generated that compensates for the error magnetic field (primary error magnetic field) caused by the eddy current that is generated as a result of applying the gradient magnetic field pulse. The computer 111 uses compensation parameters for the primary error magnetic field and measurement results of the secondary error magnetic field to calculate compensation parameters for the secondary error magnetic field. The compensation parameters calculated by the computer 111 are stored in the memory 113 and/or the internal storage unit 115. The measuring of the error magnetic fields and the calculating/storing of the compensation parameters are performed prior to the actual imaging. For example, the measuring of the error magnetic fields and the calculating/storing of the compensation parameters are performed at the time of installation or at the time of periodic maintenance of the MRI apparatus. When imaging, the measurement control unit 110 controls the shim power supply 108 and the gradient magnetic field power supply 109 using the compensation parameters stored in the internal storage unit 115 and the like as transfer functions, and determines output waveforms to be output to the correction coil and the gradient magnetic field coil.

Next, configurations of the measurement control unit 110 and the computer 111 that achieve the functions described above are described while referencing FIG. 2. Note that, in FIG. 2, only the functions of the measurement control unit 110 and the computer 111 that are related to the elimination of the error magnetic fields are illustrated, and other functions are not illustrated.

Figure 2:
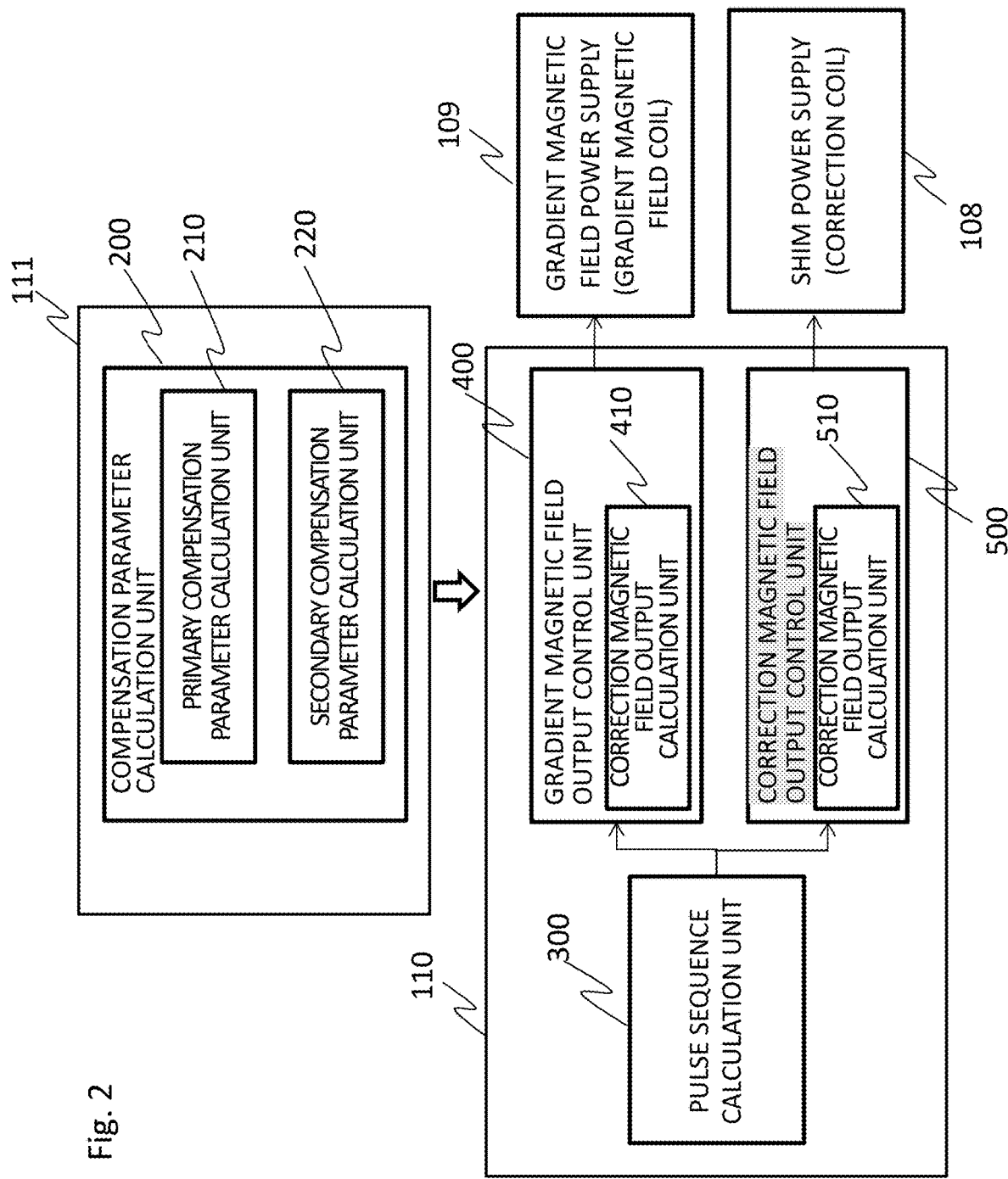
FIG. 2 is a functional block diagram of a measurement control unit and a computer of Embodiment 1.
Figure 3:
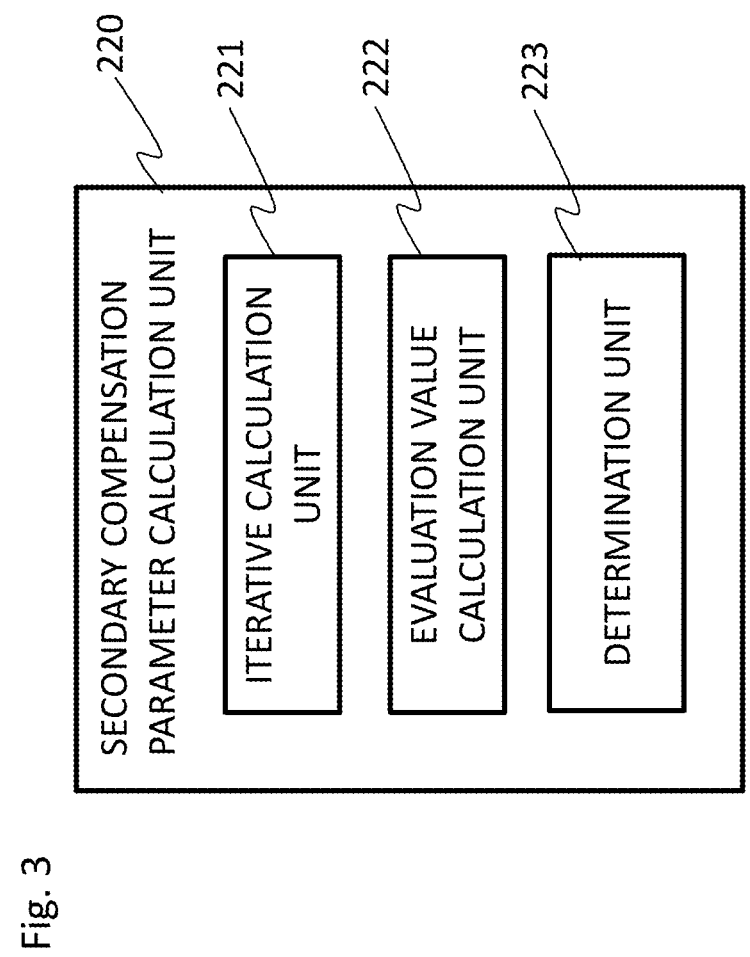
FIG. 3 is a functional block diagram of a secondary compensation parameter calculation unit.

As illustrated in FIG. 2, the computer 111 includes a compensation parameter calculation unit 200 that calculates the compensation parameters (parameter values) on the basis of the error magnetic fields measured by a pulse sequence for measuring an error magnetic field (described later). The compensation parameter calculation unit 200 includes a primary compensation parameter calculation unit 210 that calculates the compensation parameters for the primary error magnetic field, and a secondary compensation parameter calculation unit 220 that calculates the compensation parameters for the secondary error magnetic field. In one example, the primary compensation parameter calculation unit 210 calculates the compensation parameters on the basis of actual measured values of the primary error magnetic field. Specifically, the primary compensation parameter calculation unit 210 calculates an amplitude and a time constant of the primary error magnetic field as the compensation parameters. Note that this method is similar to the method described in WO 2010-143586 A. The secondary compensation parameter calculation unit 220 calculates compensation parameters (secondary compensation parameters) that match the actual measured values of the secondary error magnetic field that is measured by applying a test gradient magnetic field in the presence of the correction magnetic field output for the primary error magnetic field. In one example, the calculation of the compensation parameters by the secondary compensation parameter calculation unit 220 is performed by iterative calculation using simulations, and compensation parameters that best match the actual measured values are calculated. As such, as illustrated in FIG. 3, the secondary compensation parameter calculation unit 220 can be configured to include functional units such as an iterative calculation unit 221, an evaluation value calculation unit 222, and a determination unit 223. The specific processing of each of the functional units is described later.

The measurement control unit 110 includes a pulse sequence calculation unit 300 that uses a set imaging pulse sequence and imaging parameters to calculate magnitudes and timings of the pulses that the RF transmitting unit 106 and the gradient magnetic field power supply 109 send to the RF transmitting coil 104 and the gradient magnetic field coil 103, a gradient magnetic field output control unit 400 that uses the compensation parameters calculated by the compensation parameter calculation unit 200 to control the gradient magnetic field waveform (input waveform) calculated by the pulse sequence calculation unit 300, and a correction magnetic field output control unit 500 that uses the gradient magnetic field pulse waveform calculated by the pulse sequence calculation unit 300 and the compensation parameters calculated by the compensation parameter calculation unit 200 to control a correction magnetic field output that is applied to the correction coil (shim coil). The gradient magnetic field output control unit 400 and the correction magnetic field output control unit 500 respectively include correction magnetic field output calculation units 410 and 510 that use the gradient magnetic field waveform and the compensation parameters to calculate the correction magnetic field outputs of the error magnetic fields.

Figure 4A:
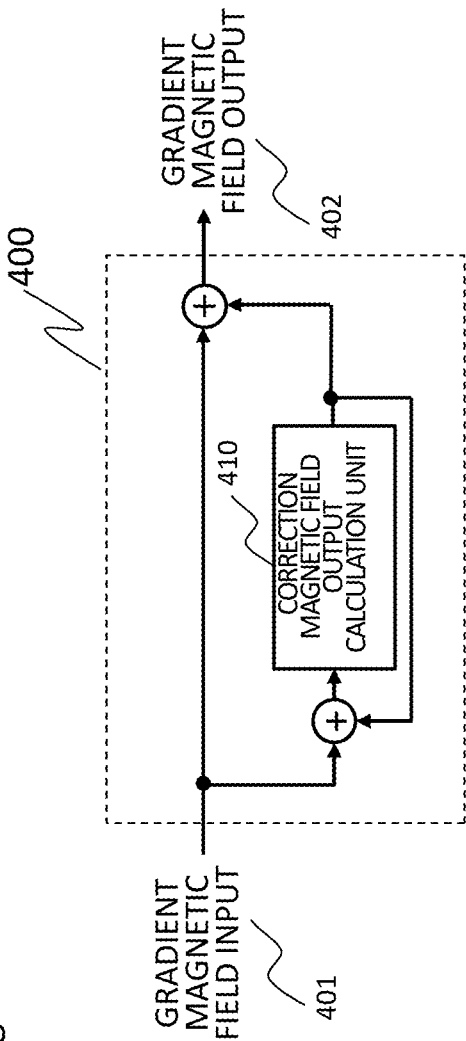
FIG. 4A is a drawing illustrating a control block of a gradient magnetic field coil that includes a correction magnetic field output calculation unit.
Figure 4B:
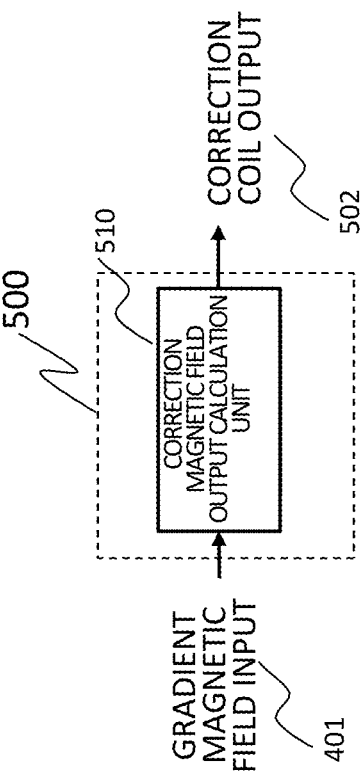
FIG. 4B is a drawing illustrating a control block of a correction coil that includes the correction magnetic field output calculation unit.

FIGS. 4A and 4B illustrate examples of control blocks of the gradient magnetic field output control unit 400 and the correction magnetic field output control unit 500. To simplify these drawings, only a single-stage error magnetic field control step is illustrated. In the control block of the gradient magnetic field output control unit 400, the correction magnetic field output calculation unit 410 calculates a correction magnetic field output 502 with a gradient magnetic field waveform 401 as the input and the compensation parameters as transfer functions. The result of adding the correction magnetic field output of the correction magnetic field output calculation unit 402 to the input waveform is applied to the gradient magnetic field power supply 109 as a gradient magnetic field output 402. Since the shape of the waveform changes due to the correction magnetic field output of the correction magnetic field output calculation unit 410 being supplied, the correction magnetic field output feeds back on itself. In the control block of the correction magnetic field output control unit 500, the correction magnetic field output calculation unit 510 calculates the correction magnetic field output 502 with the gradient magnetic field waveform 401 as the input and the compensation parameters as transfer functions, and the resulting correction magnetic field output 502 is supplied to the correction coil (the shim coil 102) via the shim power supply. That is, the correction magnetic field output 502 is superimposed on the shim current that is constantly supplied to the shim coil.

Figure 5:
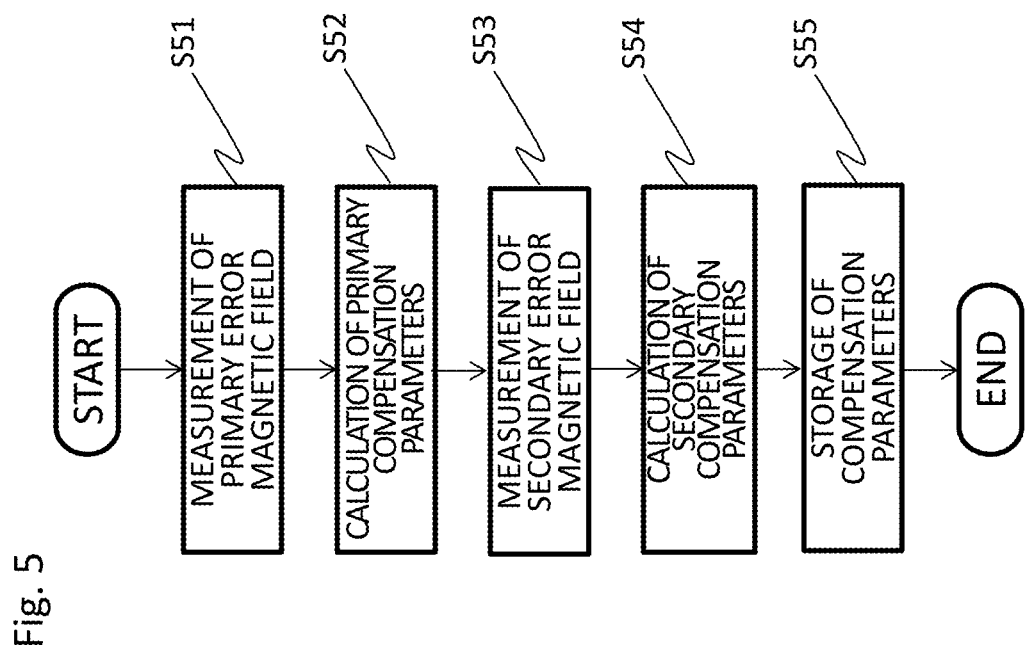
FIG. 5 is a drawing illustrating an overview of compensation parameter calculation processing according to Embodiment 1.

Next, the flow of the compensation parameter calculation and the control of the shim power supply and the gradient magnetic field power supply according to the aforementioned configuration are described. FIG. 5 illustrates an overview of the compensation parameter calculation processing.

As illustrated in FIG. 5, in the compensation parameter calculation, first, a pulse sequence for measuring an error magnetic field using the gradient magnetic field is executed and the primary error magnetic field is measured (S51). A gradient component and a polarization component of the error magnetic field are extracted using an image acquired as a result of executing the pulse sequence for measuring an error magnetic field, and the amplitude and the time constant of each component of the primary error magnetic field are calculated as the compensation parameters (S52). Next, the pulse sequence for measuring an error magnetic field is executed again using a test gradient magnetic field to which the correction magnetic field output, which uses the compensation parameters for the primary error magnetic field, is applied, and the secondary error magnetic field is measured (S53). The compensation parameters for the secondary error magnetic field are calculated using the secondary error magnetic field (measured values) that was actually measured and a correction magnetic field output waveform that uses the compensation parameters for the primary error magnetic field (S54). The resulting compensation parameters (the amplitude and the time constant of the secondary error magnetic field) are stored in the memory 113 and/or the internal storage unit 115 (S55). In one example, the steps S51 to S55 are executed when carrying out other installation adjustments when the MRI apparatus is installed in a facility or undergoes periodic maintenance.

When actually imaging, the measurement control unit 110 uses a set imaging pulse sequence and imaging parameters to control the shim power supply 108, the gradient magnetic field power supply 109, and the RF transmitting unit 106, and collects the echo data. At this time, in the application of the gradient magnetic field pulse, the measurement control unit 110 controls the input waveform (the waveform of the current to be supplied) to be input to each of the gradient magnetic field and the correction coil. Here, the compensation parameters stored in the memory 113 and/or the internal storage unit 115 is used as transfer functions.

Next, each step of FIG. 5 will be described in detail.

Measurement of Primary Error Magnetic Field: S51

A method similar to that described in WO 2010-143586 A can be adopted for the measuring of the primary error magnetic field. First, the measurement control unit 110 executes a pulse sequence for measuring an error magnetic field such as that illustrated in FIG. 6. A phantom is used for the measuring. A pulse sequence 600 involves repeating a short TR pulse sequence based on the gradient echo method, and includes units that apply a test gradient magnetic field 605 (group 1 in FIG. 6) and units that do not apply the test gradient magnetic field (group 2). With both group 1 and group 2, an RF pulse 601 is irradiated and, at the same time, a slice selection gradient magnetic field 602 is applied in a Gs direction, a desired cross-section of the phantom is excited, and a Gp direction phase encoding gradient magnetic field 603 is applied to phase encode the cross-section. Then, a Gf direction frequency encoding gradient magnetic field 604 is applied to generate an echo signal 606. This is repeated a predetermined number of times at a predetermined time TR.

Figure 6:
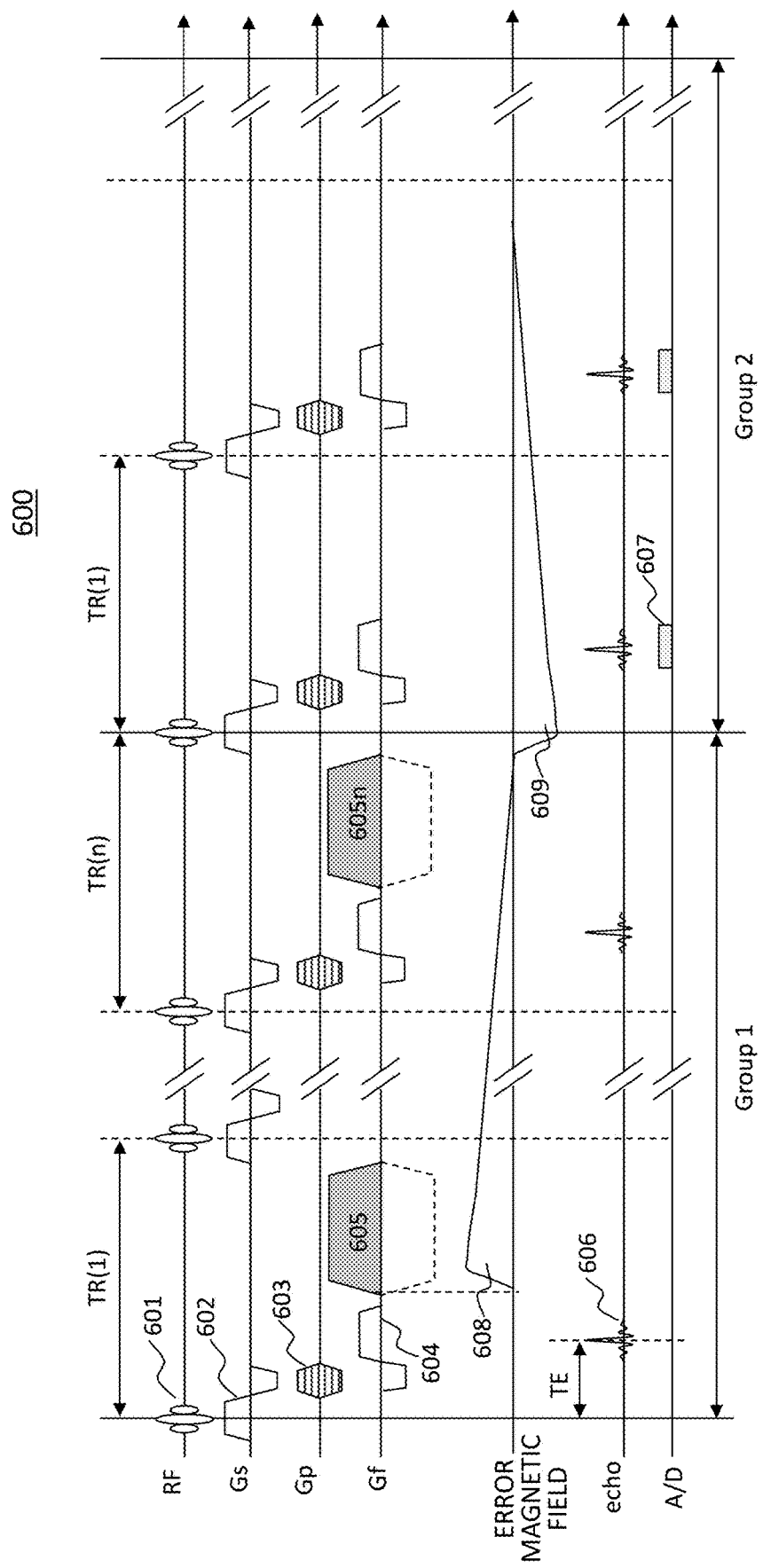
FIG. 6 is a drawing illustrating an example of a pulse sequence for measuring an error magnetic field used in Embodiment 1.

At this time, in the group 1, test gradient magnetic fields 605 to 605$n$ with predetermined intensities and times are applied each TR to the axis of the error magnetic field to be measured (a Gf direction in the example of FIG. 6). In the group 1, the generated echo signal 606 is not acquired and, in the group 2, the echo signal 606 is acquired at a sampling time 607. Thus, by continually performing the group 1 while an error magnetic field 608, which is generated at the rises of the test gradient magnetic fields 605 to 605$n$, is continuing, the echo signal 606 is measured. Here, an error magnetic field 609, which is generated at the fall of the test gradient magnetic fields in the group 2, is reflected in the echo signal 606.

The group 1 and the group 2 are repeated until the number of echo signals needed for image reconstruction is acquired. Next, the application polarities of the test gradient magnetic fields 605 to 605$n$ are reversed and the group 1 and the group 2 are repeated until the number of echo signals needed for image reconstruction is acquired.

Additionally, each of the echo signals acquired using the positive and negative test gradient magnetic fields is subjected to Fourier transformation to obtain a set of two-dimensional complex image data. By calculating the difference between the two-dimensional complex image data, difference image data is obtained. Here, the influence of the non-uniformity of the static magnetic field and the influence of the eddy current caused by the gradient magnetic fields (602, 603, and 604) that were applied for imaging are eliminated from the difference image data. The phase of the difference image data indicates the phase change amount due to the eddy current 609 that is induced when the test gradient magnetic fields 605 to 605$n$ fall.

Calculation of Compensation Parameters: S52

In this step, the fact that magnetic field fluctuation appears as phase fluctuation is used to analyze the difference image data acquired in step S51. As a result, the gradient component (the application direction and the cross term of the test gradient magnetic field) and the polarization component of the error magnetic field are extracted.

To achieve this, the primary compensation parameter calculation unit 210 calculates the phase change amount from the difference image data (complex data) acquired in step S51, and uses the phase change amount to calculate the error magnetic field at each time. Here, when the phase change amount is $\varphi(x,y)$, an error magnetic field $B(x,y,t)$ at time t can be expressed by Equation (1), below:

$$B(x,y,t)=\varphi(x,y,t)/\gamma TE \quad (1)$$

In the equation, $\gamma$ is the rotational magnetic ratio, TE is the echo time, and (x,y) is the position of the slice surface.

Error magnetic fields are known to attenuate after gradient magnetic fields are applied. The error magnetic fields can be modeled using an amplitude A and a time constant ($\tau$) of the plurality of sets expressed by Equation (2). In the modeling, the gradient component and the polarization component at each time, obtained by expanding the error magnetic field to the spherical harmonics of Equation (1), for example, may be broken down into the amplitude A and the time constant $\tau$ using a known nonlinear fitting method. Additionally, the gradient component can be simply calculated by using the magnetic field change between two arbitrary points instead of the spherical harmonics.

$$B(t) = \sum_{i=1}^{n} A_i \exp\left(-\frac{1}{\tau_i}t\right) \quad (2)$$

In the equation, n is the number of terms in the nonlinear fitting method, and i is an integer from 1 to n (same hereinafter).

Thus, the primary compensation parameter calculation unit 210 models the gradient component and the polarization component of the error magnetic field for each axis of the test gradient magnetic field, and stores, in the memory 113 and/or the internal storage unit 115 of the computer 111, the amplitude A and the time constant $\tau$ calculated for each as the compensation parameters for the primary error magnetic field.

Measurement of Secondary Error Magnetic Field: S53

The measurement control unit 110 measures error magnetic fields using a pulse sequence similar to that of the pulse sequence for measuring an error magnetic field (FIG. 6) used in step S51. However, the input waveform input into this test gradient magnetic field is, as illustrated in FIG. 4A, a waveform obtained by adding the correction magnetic field output, calculated by the correction magnetic field output calculation unit 410 using the compensation parameters calculated in step S52, to a basic step response waveform.

The pulse sequence for measuring an error magnetic field is executed using a test gradient magnetic field output from which the correction magnetic field output has been subtracted, and one set of two-dimensional complex image data that uses test gradient magnetic fields of different polarities is obtained. The acquisition of the error magnetic field information (the actual measured values of the error magnetic field) from the two-dimensional complex image data is similar to that in step S52. The actual measured values of the error magnetic field are stored in the memory and/or the internal storage unit.

Calculation of Compensation Parameters for Secondary Error Magnetic Field: S54

Figure 7:
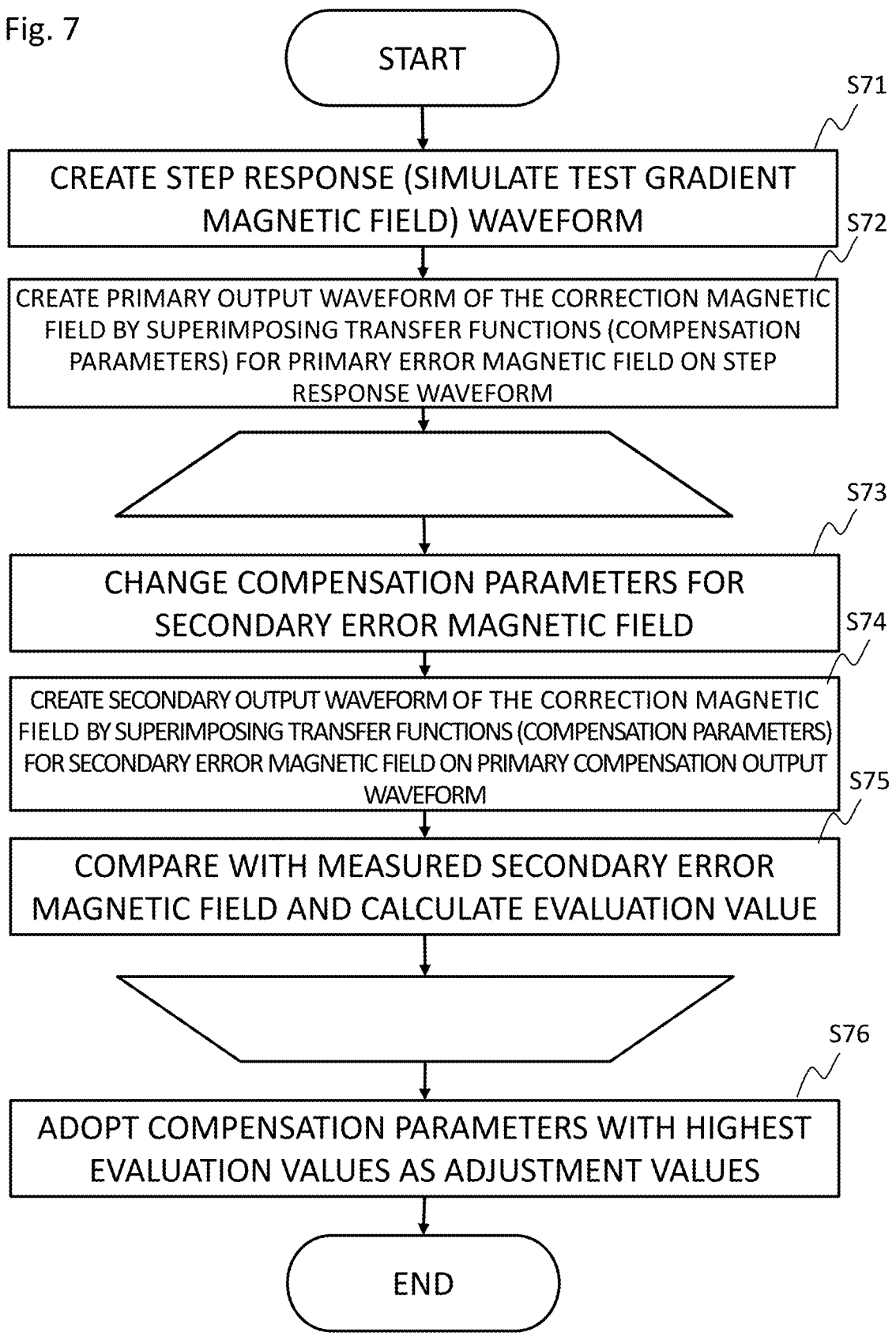
FIG. 7 is a flowchart illustrating secondary compensation parameter calculation processing.

The secondary compensation parameter calculation unit 220 creates an input waveform using the correction magnetic field output waveform of the primary error magnetic field, and calculates the compensation parameters. With regard to the compensation parameters for the primary error magnetic field, the error magnetic field waveform measured by the pulse sequence for measuring an error magnetic field itself expresses the transfer functions. However, with regard to the compensation parameters for the secondary error magnetic field, the transfer functions for the correction magnetic field output for the primary error magnetic field must be calculated and, as such, cannot be simply calculated from the measured error magnetic field. Therefore, in the present embodiment, the transfer functions are calculated by simulations of the input waveform and the output waveform (iterative calculation unit 221). Details of the step of calculating the transfer functions by the simulation are illustrated in FIG. 7.

Figure 8A:
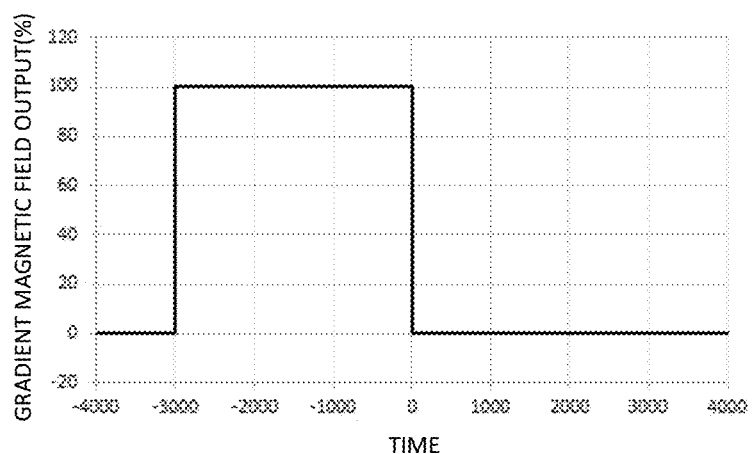
FIGS. 8A to 8C illustrate examples of a step response waveform, correction magnetic field output for a primary error magnetic field, and correction magnetic field output for a secondary error magnetic field.
Figure 8B:
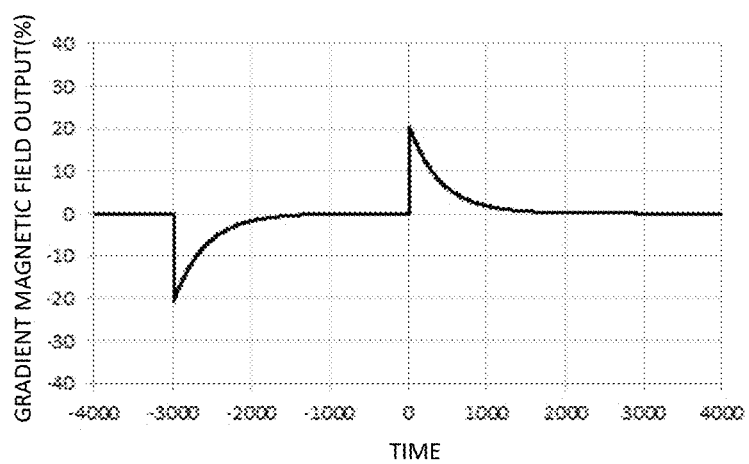

First, a step response waveform is created that simulates a test gradient magnetic field that was used for the measurement of the primary error magnetic field (S71). In one example, the step response waveform is a rectangular waveform such as that illustrated in FIG. 8A. Next, in accordance with Equation (3), a primary output waveform is created by superimposing the correction magnetic field output for the primary error magnetic field on the step response waveform (S72). The correction magnetic field output for the primary error magnetic field that is superimposed on the step response waveform has the amplitude and the time constant that were calculated in step S52, and has a shape such as that illustrated in FIG. 8B, for example.

$$g(t)=\Sigma_{i=1}^{N} A_i((t-1)*[f(t)-D_i(t-1)] \quad (3)$$

In Equation (3), f(t) is the input waveform (the step response waveform), g(t) is the primary output waveform, and D(t) is a function expressed by Equation (4).

$$D_i(t) = (\tau_i - 1.0)D_i(t-1) + \frac{f(t)}{\tau_i} \quad (4)$$

Next, with the primary output waveform created in step S72 as the input, the values of the compensation parameters for the secondary error magnetic field are changed to various values, and a secondary correction magnetic field output waveform is calculated (S73 and S74). Specifically, in step S73, desired initial values (may be 0) are set as the amplitude and the time constant and, in step S74, the transfer functions determined by the compensation parameters are superimposed on the primary correction magnetic field output waveform. Thus, the secondary correction magnetic field output waveform is created. The created secondary correction magnetic field output waveform corresponds to an error magnetic field on which the secondary error magnetic field is superimposed. The evaluation value calculation unit 222 compares the calculated value with the error magnetic field that was actually measured, and calculates an evaluation value that indicates a degree of matching with the actual measured value. An absolute value error, square error, correlation coefficient, or the like therebetween can be used as the evaluation value. The iterative calculation unit 221 varies the compensation parameters for the secondary error magnetic field while repeating steps S73 to S75, and the determination unit 223 adopts, as adjustment values, the compensation parameters that provided the secondary compensation waveform with the highest evaluation value, that is, the secondary compensation waveform that best matches the actual measured values (S76).

Figure 9A:
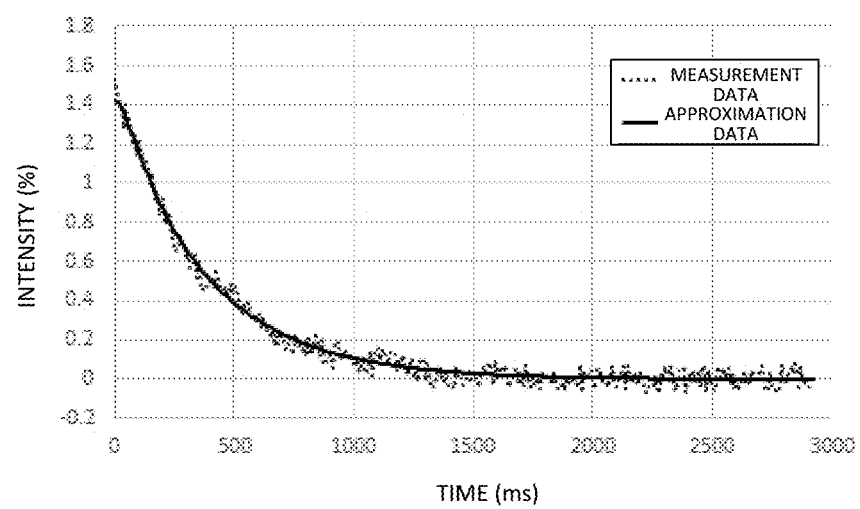
FIG. 9A illustrates an example of measurement data and approximation data, obtained by simulation, of the primary error magnetic field.
Figure 9B:
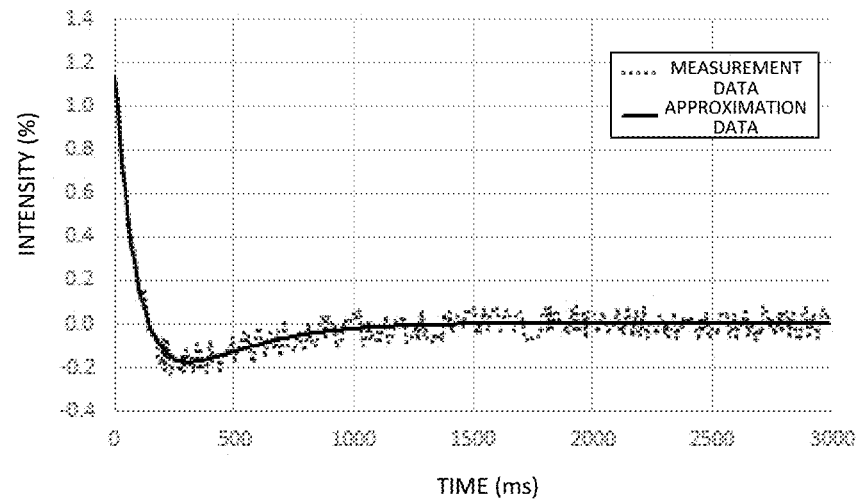
FIG. 9B illustrates an example of measurement data and approximation data, obtained by simulation, of the secondary error magnetic field.

FIG. 9 illustrates examples of measurement data and approximation data, obtained by simulation, of the error magnetic fields. FIG. 9A illustrates the measurement data and the approximation data, obtained by simulation, of the primary error magnetic field. FIG. 9B illustrates the measurement data and the approximation data, obtained by simulation, of the secondary error magnetic field. It is clear that the primary error magnetic field decreases exponentially, and that the secondary error magnetic field changes in a more complex manner.

Figure 8C:
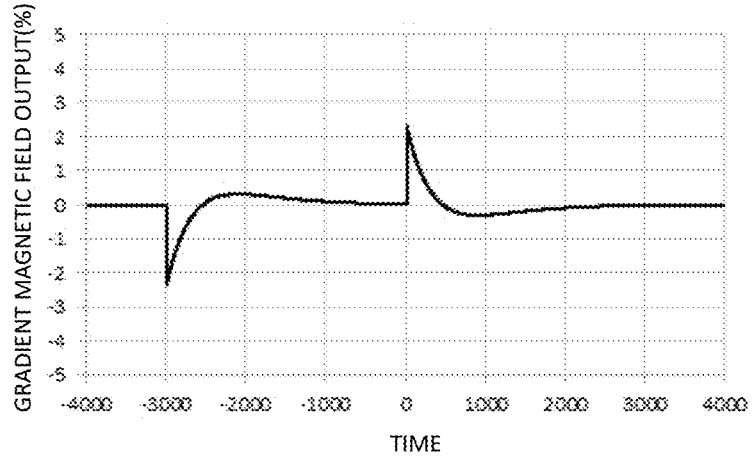

In step S54, an iterative simulation is used and, as such, data that closely approximates the secondary error magnetic field can be obtained and, ultimately, correction magnetic field output for the secondary error magnetic field such as that illustrated in FIG. 8C can be obtained. Note that, in the present embodiment, since the error magnetic field is calculated as a response from the fall of the test gradient magnetic field, the starting point of the fall is set to 0 on the time axis in FIGS. 8A to 8C. Accordingly, the evaluation value can be obtained by comparing the waveform after the time of 0 ms with the actual measured waveform.

The secondary compensation parameter calculation unit 220 performs the processing of step S54 for each of the polarization component and the gradient component of the error magnetic field calculated in step S52, calculates each of the compensation parameters, and stores the compensation parameters (the amplitude A and the time constant τ) calculated for each axis and for each component in the memory 113 and/or the internal storage unit 115 as the compensation parameters for the secondary error magnetic field (S55). Steps S51 to S55 of FIG. 5, which are the processes for the initial settings or for maintenance settings, are thus completed.

Imaging

The measurement control unit 110 controls the imaging device and performs imaging in accordance with imaging parameters and an imaging sequence that are set by the user or are preset. At this time, the measurement control unit 110 uses compensation parameters stored in advance in the internal storage unit 115 and the like to control the gradient magnetic field power supply 109 and the shim power supply 108 so that output, which takes the correction magnetic field output for the secondary error magnetic field into account, is supplied to the gradient magnetic field coil 103 and the correction coil 102.

Figure 10A:
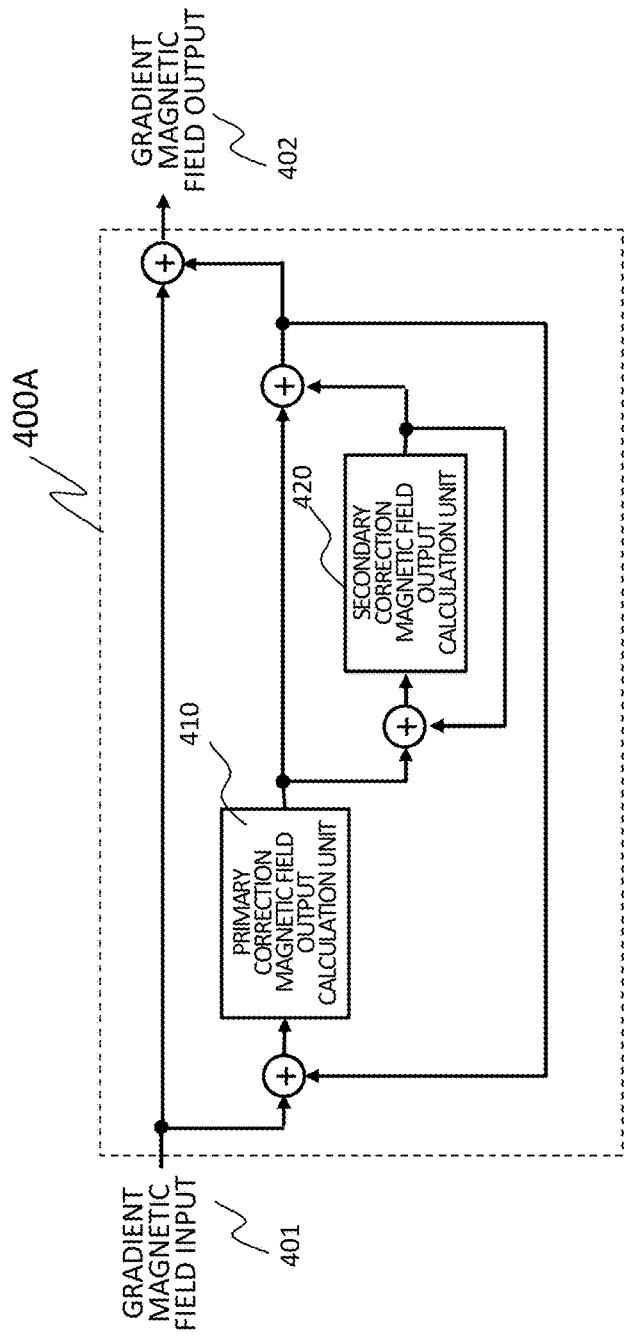
FIG. 10A is a drawing illustrating a control block of the correction magnetic field output of a gradient magnetic field coil according to Embodiment 1.
Figure 10B:
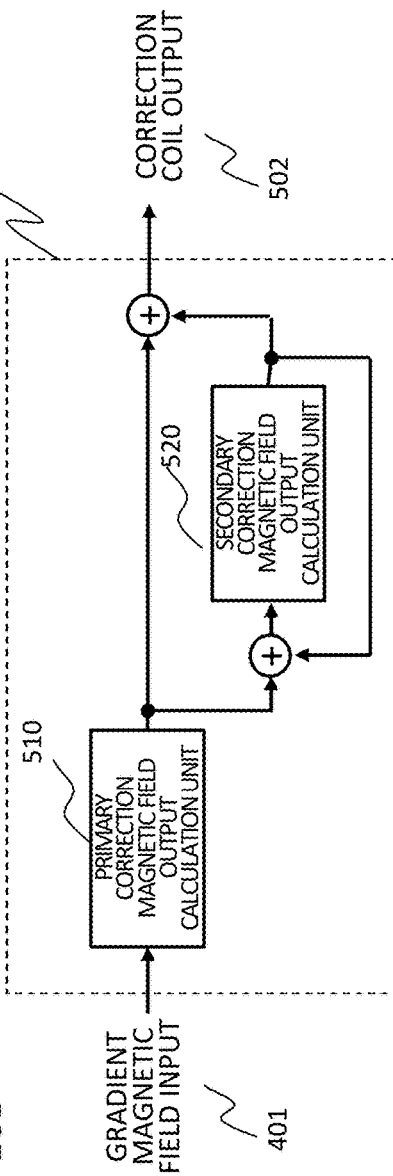
FIG. 10B is a drawing illustrating a control block of the correction magnetic field output of a correction coil according to Embodiment 1.

The control blocks of the present embodiment (gradient magnetic field output control unit 400A and correction magnetic field output control unit 500B) are illustrated in FIGS. 10A and 10B. Regarding the gradient magnetic field coil 103, as illustrated in FIG. 10A, when the input waveform (design waveform) 401 of the gradient magnetic field is input, the primary correction magnetic field output calculation unit 410 calculates the correction magnetic field output using the primary compensation parameter found for the gradient component of the error magnetic field, and sends that output to a secondary correction magnetic field output calculation unit 420. The secondary correction magnetic field output calculation unit 420 uses the secondary compensation parameter, calculated for the gradient component of the secondary error magnetic field in step S54, to calculate the correction magnetic field output for the secondary error magnetic field, and outputs this correction magnetic field output. The outputs of both the primary correction magnetic field output calculation unit 410 and the secondary correction magnetic field output calculation unit 420 are superimposed on the input waveform 401 to obtain the gradient magnetic field output 402. The output (combined value) of the primary correction magnetic field output calculation unit 410 and the secondary correction magnetic field output calculation unit 420 feeds back to the primary correction magnetic field output calculation unit 410, and the output of the secondary correction magnetic field output calculation unit 420 feeds back to itself.

Regarding the correction coil 102, as illustrated in FIG. 10B, with the gradient magnetic field waveform 401 as the input, the primary correction magnetic field output calculation unit 510 calculates the correction magnetic field output using the primary compensation parameter found for the polarization component of the error magnetic field, and sends that output to the secondary correction magnetic field output calculation unit 520. The secondary correction magnetic field output calculation unit 520 uses the secondary compensation parameter, calculated for the gradient component of the secondary error magnetic field in step S54, to calculate the correction magnetic field output for the secondary error magnetic field, and outputs this correction magnetic field output (correction coil output 502). The outputs of both the primary correction magnetic field output calculation unit 510 and the secondary correction magnetic field output calculation unit 520 are superimposed on the input waveform 401 to obtain the correction coil output 502. The output of the secondary correction magnetic field output calculation unit 520 feeds back to itself.

As a result of the processing described above, when imaging, the gradient magnetic field coil can be driven by output in which the primary error magnetic field generated as a result of the application of gradient magnetic field pulses and the secondary error magnetic field that is caused by the primary error magnetic field are compensated for. Thus, image quality degradation caused by the error magnetic fields can be prevented. In particular, even though MRI apparatuses have non-negligible secondary error magnetic fields that are generated due to device restrictions, high image quality that compensates for these device restrictions can be realized.

Embodiment 2

In Embodiment 1, the gradient component and the polarization component of the secondary error magnetic field are each measured and modeled in order to obtain the correction magnetic field output for the gradient magnetic field coil that also includes correction for the secondary error magnetic field. However, in the present embodiment, the components to be modeled are limited to components for which the primary error magnetic field is expected to be great and problematic, and the number of steps and time required for the measuring of the secondary error magnetic field and the compensation parameter calculation are reduced.

Figure 11:
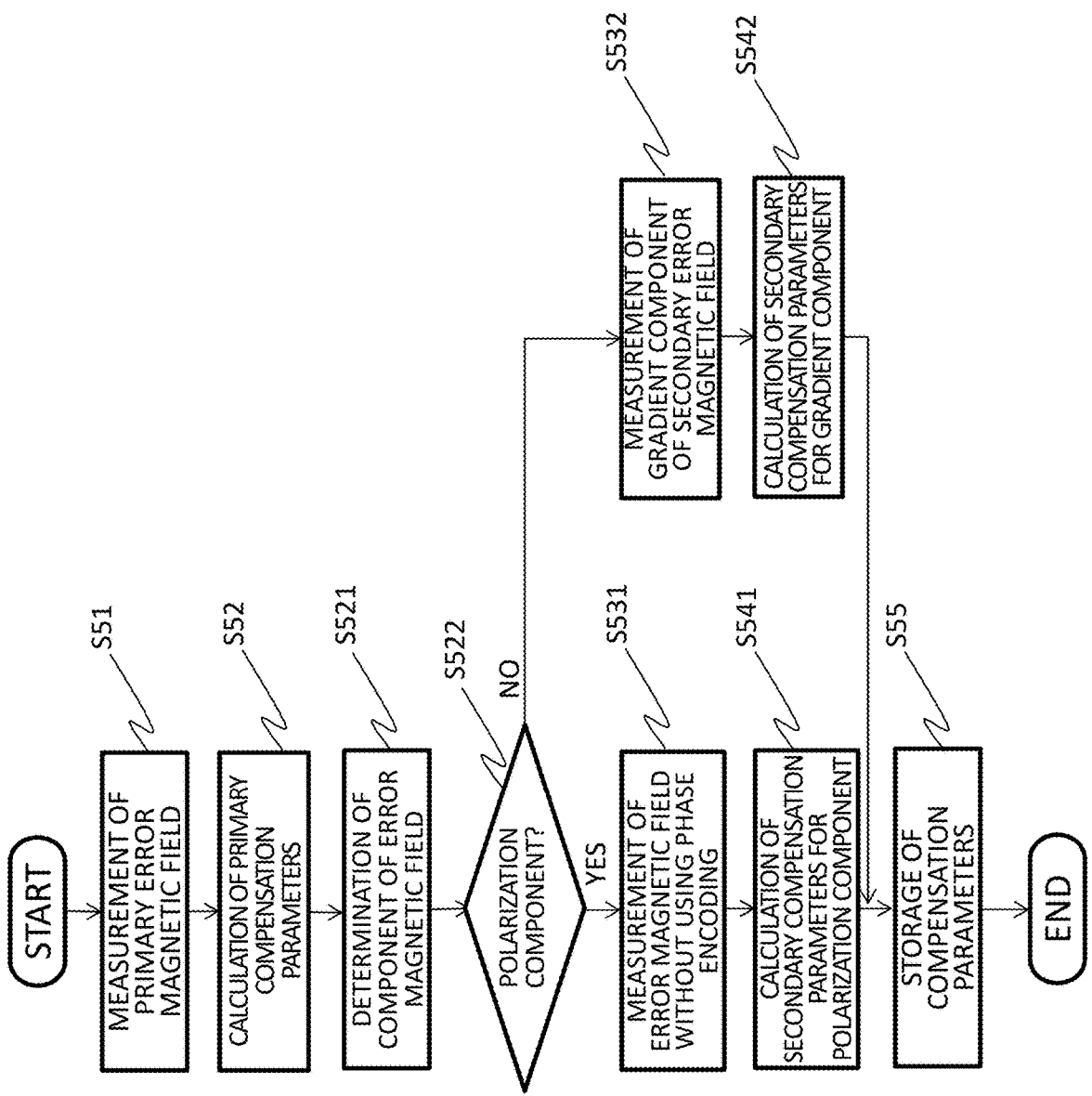
FIG. 11 is a flowchart illustrating compensation parameter calculation processing according to Embodiment 2.

In the present embodiment, the configurations of the measurement control unit 110 and the computer 111 are similar to the configurations described in Embodiment 1. As such, FIG. 2, which is used in Embodiment 1, is referenced as needed in the following description. Next, the flow of the control of the shim power supply and the gradient magnetic field power supply of the present embodiment is described while referencing FIG. 11. In FIG. 11, parts of the processing that are the same as the processing of FIG. 5 are marked with the same reference numerals, and description thereof is foregone. The features that differ from Embodiment 1 are mainly described.

First, the pulse sequence for measuring an error magnetic field such as that illustrated in FIG. 6 is executed, and the error magnetic fields are measured for each axis of the gradient magnetic field (S51). Compensation parameters for the gradient component and the polarization component of the three axial directions are calculated for the error magnetic field of each axis (S52). Next, the values of the compensation parameters are analyzed and the secondary error magnetic field of the component to be measured is determined (S521). Regarding the determination of the component to measure, a determination may be made in advance as whether to measure the polarization component or the gradient component. For example, when importance is to be attached to the uniformity of the static magnetic field, the polarization component, which affects the uniformity of the static magnetic field greater than the gradient component, is measured. Regarding the gradient component, only the magnetic field error component of the axis that is the same as that of the gradient magnetic field to be applied (the linear term component) is measured, and the error components of the axes that are orthogonal to the axis of application (the cross term components) are ignored. In another example, threshold values for each of the compensation parameters (the amplitude A and the time constant τ) of the primary error magnetic field may be set, and the component to be measured may be determined on the basis of if the amplitude is greater than or equal to a threshold value of the amplitude and/or if the time constant is less than or equal to a threshold value of the time constant.

Figure 12:
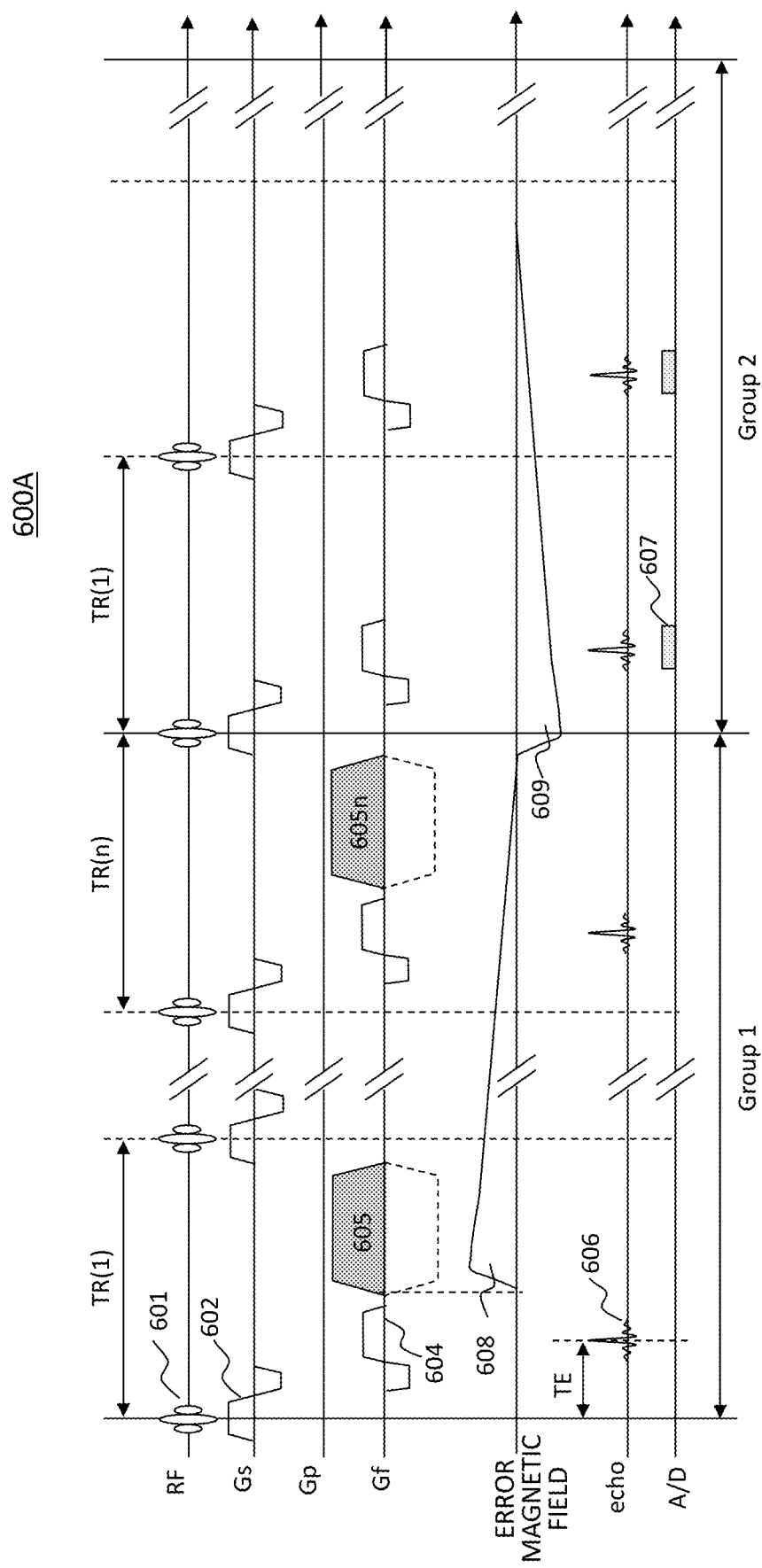
FIG. 12 is a drawing illustrating an example of a pulse sequence for measuring an error magnetic field used in Embodiment 2.

In step S521, when the polarization component is selected as the component of the secondary error magnetic field to be measured (S522), a pulse sequence for measuring an error magnetic field 600A that does not use phase encoding, such as that illustrated in FIG. 12, is executed (S531). The pulse sequence illustrated in FIG. 12 also consists of a group 1 that continuously applies the test gradient magnetic field 605 every TR, and a group 2 that collects the echo signal 606 every TR. Additionally, the measuring of the error magnetic field at the fall, in the group 2, of the test gradient magnetic field applied by the group 1 is the same as the pulse sequence 600 illustrated in FIG. 6. The input waveform of the test gradient magnetic field 605 is obtained by subtracting the correction magnetic field output waveform obtained by using the compensation parameters calculated in step S52 as transfer functions.

However, the pulse sequence illustrated in FIG. 12 does not include the phase encoding for providing the position information, and only measures a single slice. This is because the polarization component, which is the component to be measured, is not position dependent and, as such, the secondary error magnetic field can be measured from projection data of the center of the magnetic field or space including the center of the magnetic field. Accordingly, assuming that, with the sequence pattern (FIG. 6) for measuring the primary error magnetic field, the measurement time of one axis is 30 minutes where the number of phase encodings is 32 and the number of slices is 2, in the sequence pattern illustrated in FIG. 12, the measurement time of one axis can be shortened to about 30 seconds (=30 min/64)

Additionally, the error magnetic field (the polarization component) is calculated using the echo data obtained in the measurement sequence 600A. The error magnetic field can be calculated from the phase of the measured echo peak. In the measurement sequence 600A illustrated in FIG. 12, the echo signal is measured by applying a frequency encoding gradient magnetic field. As such, the error magnetic field is calculated via Equation (1) using the phase value of the Fourier transformed data center of the echo signal. Note that, since position information is unnecessary for the error magnetic field of the polarization component, in the measurement sequence illustrated in FIG. 12, the echo signal may be collected without applying a frequency encoding gradient magnetic field. In such a case, the average phase of the Fourier transformed acquired data may be used as the phase value.

Next, the error magnetic fields (measured values) at each time are analyzed and the compensation parameters are calculated (S541). A method similar to the method illustrated in FIG. 7 of Embodiment 1 (iterative calculation by simulation) can be adopted for this analysis and calculation. A step of evaluating the error magnetic field, obtained by applying compensation parameters to a primary correction magnetic field output waveform obtained by superimposing the transfer functions of the primary error magnetic field on a step response waveform, is repeated while changing the compensation parameters, and the compensation parameters that best match the actual measured values are found. The compensation parameters calculated for each axis are stored in the internal storage unit 115 or the like (S55).

Meanwhile, in step S522, even when the gradient component is selected as the component of the secondary error magnetic field to be measured, the gradient component is measured using a measurement sequence that does not use phase encoding, similar to when the polarization component is selected (S532). However, the axis of the frequency encoding gradient magnetic field to be applied to read the echo signal is set to the direction of the gradient component to be found. For example, phase data of the gradient component of the same axis as the test gradient magnetic field (the linear term component) can be obtained by setting the axis of the frequency gradient magnetic field to the same axis as the test gradient magnetic field, and adding position information to the echo signal in the axial direction of the test gradient magnetic field. Generally, for primary error magnetic fields, the influences of the linear term component and also the components in directions orthogonal to the primary error magnetic field (the cross terms) cannot be ignored. However, for the secondary error magnetic field, since the cross term components are smaller than the linear term component, only the linear term component needs to be compensated for.

The echo data obtained in this measurement sequence is Fourier transformed. Thus, the phase data is obtained. While this phase data is a projection of the phase encoding direction, phase data of a position at a given distance from the center of the magnetic field can be obtained for the axial direction of the frequency encoding. Phase data of the linear term component of each axis can be obtained by executing the measurement sequence illustrated in FIG. 12 for each axis of the test gradient magnetic field.

The error magnetic field is calculated using this phase data, and the compensation parameters are calculated (S542). The compensation parameters calculated for each axis in step S542 are stored in the internal storage unit 115 or the like (S55).

The measurement control unit 110, which uses the stored compensation parameters to control the shim power supply 108 and the gradient magnetic field power supply 109 when actually imaging, is similar to that carried out in Embodiment 1.

According to the present embodiment, the component of the secondary error magnetic field for which the compensation parameters are to be found is limited and, as a result, a pulse sequence for measuring a secondary error magnetic field with short measuring time can be adopted. Due to this, the time required for the error magnetic field measurement step and the compensation parameters calculation step can be greatly shortened. In particular, by limiting to the polarization component, the measurement time of the secondary error magnetic field can be greatly shortened.

Note that, in FIG. 11, in the determination step S521, an example is illustrated in which one of the gradient component and the polarization component is determined. However, a configuration is possible in which compensation parameters are calculated for the gradient component and, also, the phase of the center portion of the same echo data is used to calculate compensation parameters for the polarization component. Such an embodiment is included in the present embodiment.

Modification Examples

In the embodiment described above, in the pulse sequence for measuring an error magnetic field illustrated in FIG. 12, the number of applications (n) of the test gradient magnetic field is not particularly specified. However, the number of applications of the test gradient magnetic field is dependent on the time constant of the error magnetic field. That is, more applications are needed for longer time constants. One characteristic of the apparatus is that, typically, the transfer functions of the secondary error magnetic field have short time constants. Accordingly, in cases in which the number of applications is set by default to enable the measuring of the characteristics of a time constant of about 3000 ms, if it is known that the time constant of the error magnetic field to be measured is 1000 ms, the number of applications may be changed to ⅓ the number of applications set by default.

For the time constant of the error magnetic field to be measured, a time constant that is obtained by calculating from the error magnetic field measured on an axis of one test gradient magnetic field may be used, or an empirical value may be set by the user via the UI unit. In the case of the former, the measurement control unit 110 first measures the error magnetic field of the linear term component at the number of applications of the test gradient magnetic field set by default for one axis and, based on the measurement results, the measurement control unit 110 uses the time constant calculated by the computer 111 (the compensation parameter calculation unit 200) to change the number of applications of the test gradient magnetic field for the measurement sequences of the other axes. In cases in which the user settings are used, the set time constant is used to calculate the necessary number of applications, and sets the result as the parameter of the measurement sequence and executes the measurement sequence.

According to the present embodiment, depending on the features of the apparatus, the minimum number of applications can be set as the parameter of the pulse sequence for measuring the secondary error magnetic field, and the adjustment time when installing or performing maintenance can be further shortened.

Embodiment 3

In Embodiment 1 and Embodiment 2, examples are described in which the error magnetic field generated secondarily by the correction magnetic field output for the error magnetic field caused by the applying of the gradient magnetic field pulse is modeled, and correction magnetic field output is obtained. However, a configuration is possible in which error magnetic fields of higher orders are compensated for.

Figure 13:
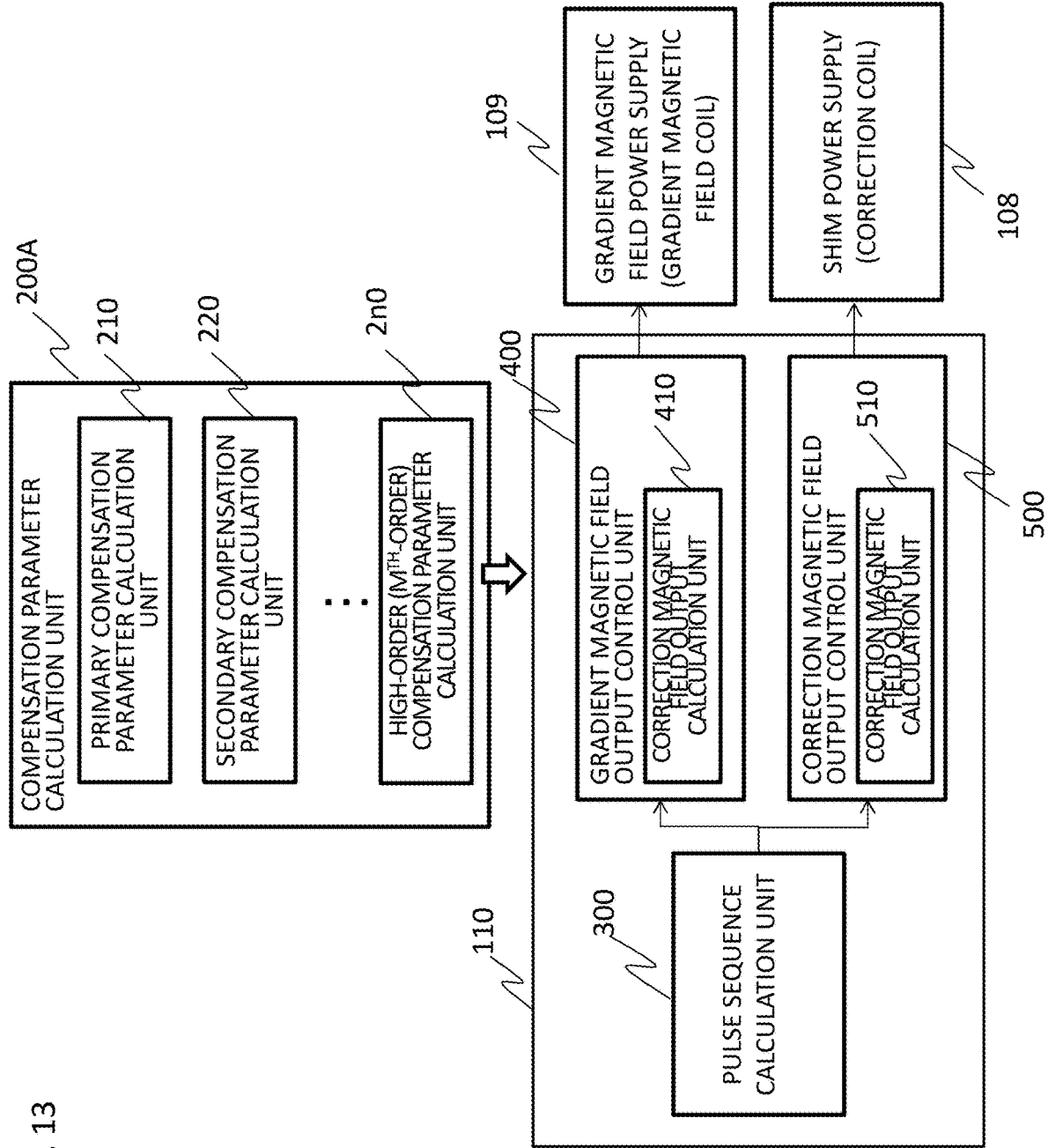
FIG. 13 is a functional block diagram of a measurement control unit and a computer of Embodiment 3.

FIG. 13 illustrates the configurations of the measurement control unit 110 and the computer 111 related to the elimination of the error magnetic field of the present embodiment. The measurement control unit 110 of the present embodiment includes a high-order compensation parameter calculation unit 250. The secondary compensation parameter calculation unit 220 of Embodiment 1 may be configured to function as the high-order compensation parameter calculation unit 250 not only to calculate the secondary error magnetic field, but also to calculate tertiary and higher error magnetic fields. The control blocks of the gradient magnetic field output control unit 400 and the correction magnetic field output control unit 500 are replaced with the control blocks illustrated in FIGS. 14 and 15. Note that FIGS. 14 and 15 illustrate an example in which the correction magnetic field output for a tertiary error magnetic field is calculated.

The high-order compensation parameter calculation unit 250 performs iterative calculation while varying the value of the compensation parameters to be applied to the input waveform, similar to the secondary compensation parameter calculation unit 220 of Embodiment 1, and calculates the compensation parameters that provide an error magnetic field that best matches the actual measured values. At this time, a waveform to which the previous compensation parameters (when the $m^{th}$, the $(m-1)^{th}$; m is an integer of 3 or greater) are applied is used as the input waveform, and data of a measurement sequence that uses the test gradient magnetic field to which the previous correction magnetic field output is applied are used as the actual measured values. Thus, compensation parameters can be calculated for error magnetic fields of the tertiary and higher by changing the input waveform and the actual measured values, similar to the calculation of the compensation parameters for the secondary error magnetic field.

Figure 14:
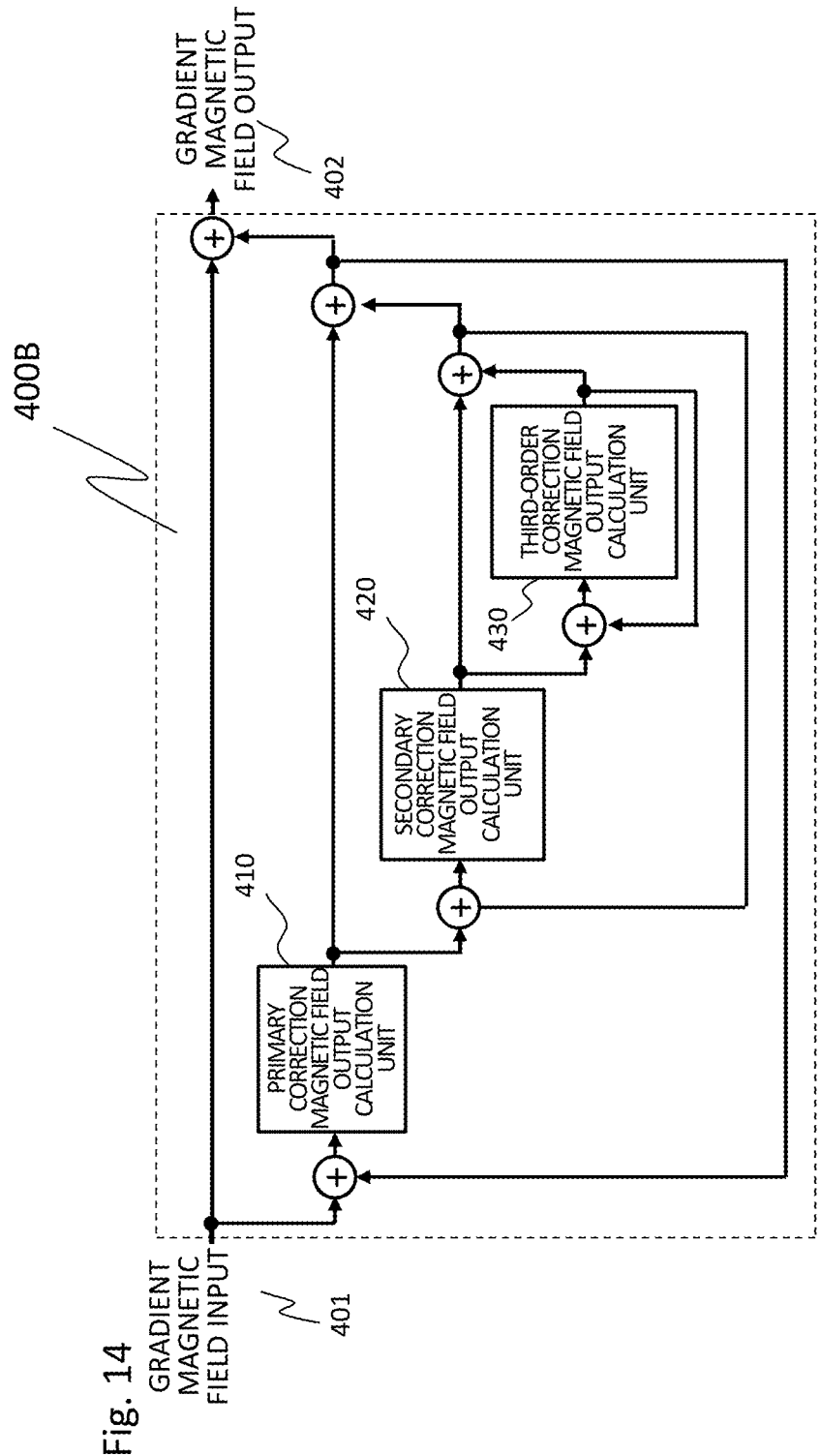
FIG. 14 is a drawing illustrating a control block of a gradient magnetic field coil of Embodiment 3.

Regarding the measurement control unit 110 (a gradient magnetic field output control unit 400B), as illustrated in FIG. 14, a tertiary correction magnetic field output calculation unit 430 is added to the output side of the secondary correction magnetic field output calculation unit 420. With the output of the secondary correction magnetic field output calculation unit 420 as input, the tertiary correction magnetic field output calculation unit 430 calculates and outputs a correction magnetic field output for the tertiary error magnetic field using tertiary compensation parameters calculated by the high-order compensation parameter calculation unit 250. The output of the tertiary correction magnetic field output calculation unit 430 is added to the output of the secondary correction magnetic field output calculation unit 420, then added to the output of the primary correction magnetic field output calculation unit 410, and then added to the gradient magnetic field output. The output of the tertiary correction magnetic field output calculation unit 430 feeds back on itself.

Figure 15:
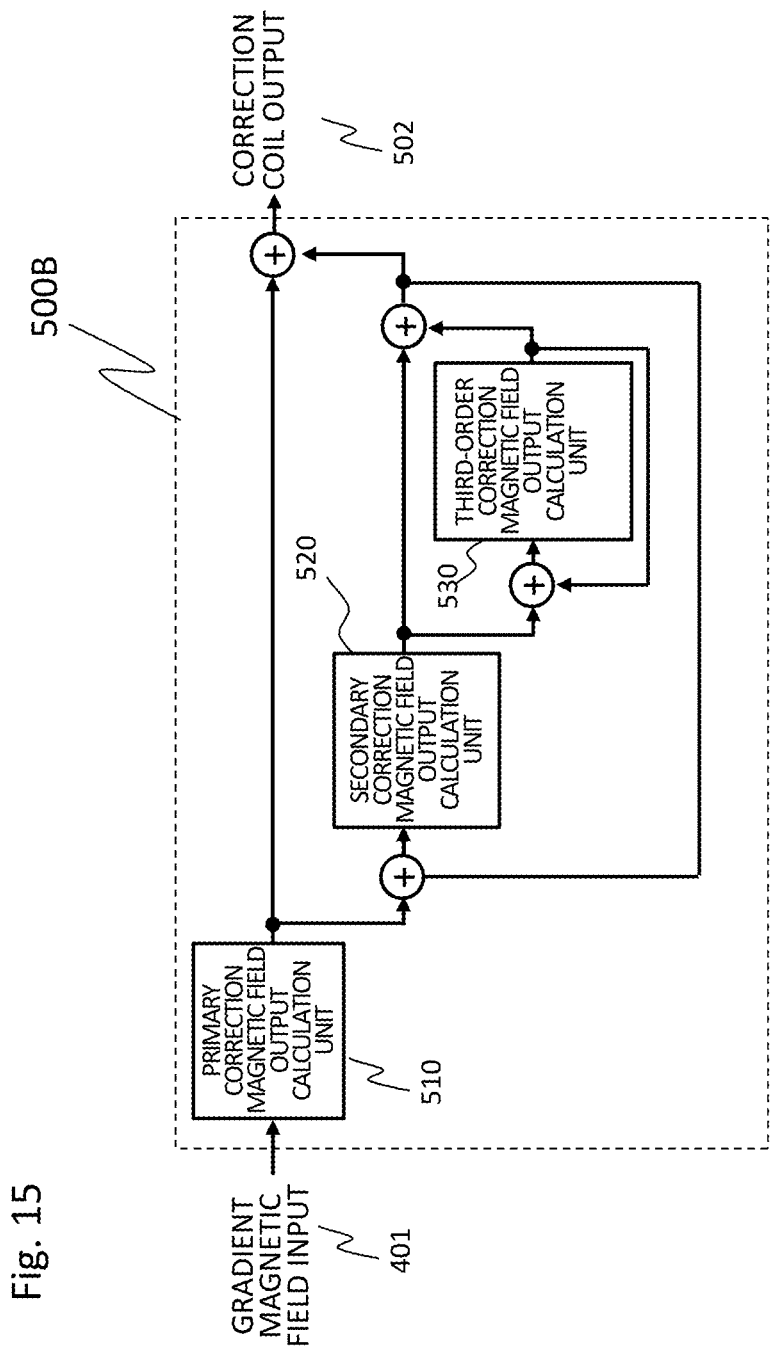
FIG. 15 is a drawing illustrating a control block of a correction coil of Embodiment 3.

Regarding a correction magnetic field output control unit 500B, as illustrated in FIG. 15, the tertiary correction magnetic field output calculation unit 430 is added to the output side of the secondary correction magnetic field output calculation unit 420, and similar control is performed.

In the forgoing, an example of compensation for a tertiary error magnetic field is described, but for a quaternary or higher error magnetic field, it is sufficient to calculate the compensation parameters similar to the flow illustrated in FIG. 7, and add a quaternary or higher correction magnetic field output calculation unit. In the case of compensating for the $m^{th}$ error magnetic field, the error magnetic fields will be measured in order in multiple stages from the primary. For each measuring of the $m^{th}$ error magnetic field, the measurement range of the error magnetic field may be changed so as to compensate for the error magnetic field that has the greatest effect, similar to the procedure following the secondary error of Embodiment 2. As a result, the measurement time can be more greatly optimized.

Note that, when compensating for tertiary or higher error magnetic fields, a person can determine, as desired, the order to which the error magnetic field will be compensated for, and the measurements may be repeated until the amount of error magnetic fields to be measured is less than a certain amount. In one example, the certain amount is a gradient component of less than 0.05% and a polarization component of less than 0.5%. As a result, the need for determination by a human is eliminated, and high compensation accuracy can easily be obtained. When the error magnetic fields do not converge, it may be determined that a malfunction or the like of the apparatus has occurred which cannot be resolved by the error magnetic field compensation circuit. As such, the present invention can be applied to inspection tools that are used when shipping.

What is claimed is:

1. A magnetic resonance imaging apparatus, comprising:
   a static magnetic field magnet that generates a static magnetic field;
   a transmitter/receiver that irradiates a high frequency magnetic field on a subject that is placed in the static magnetic field, and collects nuclear magnetic resonance signals generated from the subject;
   a gradient magnetic field coil that adds a gradient magnetic field to the static magnetic field;
   a correction coil that corrects non-uniformity of the static magnetic field;
   a measurement control unit that controls the transmitter/receiver, the gradient magnetic field coil, and the correction coil; and
   a compensation parameter calculation unit that performs calculations related to imaging, wherein
   the compensation parameter calculation unit includes a primary compensation parameter calculation unit that calculates primary compensation parameters for a primary error magnetic field, and a secondary compensation parameter calculation unit that calculates secondary compensation parameters for a secondary error magnetic field, wherein
   the primary compensation parameter calculation unit uses measurement values of the primary error magnetic field as the primary compensation parameters, generated as a result of applying a test gradient magnetic field of one or a plurality of axes, accompanying with a primary correction magnetic field output for the primary error magnetic field of a gradient magnetic field pulse of each axis, and wherein
   the secondary compensation parameter calculation unit calculates, as the secondary compensation parameters, transfer functions whereby an output waveform obtained by applying transfer functions to a step response waveform of the test gradient magnetic field on which the primary correction magnetic field output for the primary error magnetic field is superimposed, best matches measurement values of the secondary error magnetic field; and
   the measurement control unit includes a primary correction magnetic field output calculation unit that uses the primary compensation parameters for the primary error magnetic field to calculate the primary correction magnetic field output and a secondary correction magnetic field output calculation unit that uses the secondary compensation parameters for the secondary error magnetic field to calculate a secondary correction magnetic field output; wherein
   both the primary correction magnetic field output and the secondary correction magnetic field output are superimposed to be sent as feedback to the primary correction magnetic field output calculation unit, and a last superimposed output after the feedback is supplied as a gradient magnetic field output to the gradient magnetic field coil; and
   both the primary correction magnetic field output and the secondary correction magnetic field output, without feedbacking to the primary correction magnetic field output calculation unit, are superimposed as a correction coil output to be supplied to the correction coil.

2. The magnetic resonance imaging apparatus according to claim 1, wherein the measurement control unit executes a pulse sequence for measuring the secondary error magnetic field that uses, as an output waveform of the test gradient magnetic field, a waveform obtained by superimposing the primary correction magnetic field output for the primary error magnetic field on the step response waveform of the test gradient magnetic field, and collects echo data.

3. The magnetic resonance imaging apparatus according to claim 1, wherein the secondary compensation parameter calculation unit calculates the secondary compensation parameters for at least one of a polarization component and a gradient component of the secondary error magnetic field.

4. The magnetic resonance imaging apparatus according to claim 2, wherein the measurement control unit executes, as the pulse sequence for measuring the secondary error magnetic field, a pulse sequence that collects echo data without using phase encoding.

5. The magnetic resonance imaging apparatus according to claim 4, wherein the secondary compensation parameter calculation unit uses a phase of data of a center proximity region that includes a center region or a center of the echo data collected by the pulse sequence suitable for the measurement of the pulse sequence for measuring the secondary error magnetic field to calculate the secondary compensation parameters for a polarization component of the secondary error magnetic field.

6. The magnetic resonance imaging apparatus according to claim 5, wherein the secondary correction magnetic field output calculation unit uses the secondary compensation parameters for the polarization component to calculate a secondary correction magnetic field output of the polarization component, and the measurement control unit supplies the secondary correction magnetic field output of the polarization component to the correction coil.

7. The magnetic resonance imaging apparatus according to claim 4, wherein:
   the measurement control unit executes the pulse sequence for measuring the secondary error magnetic field with an axis of the test gradient magnetic field and an axis of a frequency encoding gradient magnetic field being identical, and
   the compensation parameter calculation unit calculates compensation parameters for a gradient component of the secondary error magnetic field for the axis of the frequency encoding gradient magnetic field.

8. The magnetic resonance imaging apparatus according to claim 1, wherein the compensation parameter calculation unit further includes an $m^{th}$ compensation parameter calculation unit that calculates compensation parameters for an $m^{th}$ error magnetic field that is accompanying with correction magnetic field outputs from a primary error magnetic field to an (m−1)t error magnetic field, where m is an integer of 3 or greater.

9. The magnetic resonance imaging apparatus according to claim 8, wherein the compensation parameter calculation unit further includes a determination unit that determines whether calculation of compensation parameters for the $m^{th}$ error magnetic field is necessary on the basis of the $(m-1)^{th}$ error magnetic field.

10. A method of compensating for a primary error magnetic field in which a gradient magnetic field coil of a magnetic resonance imaging apparatus is driven together with correction magnetic field output to correct a secondary error magnetic field that occurs in at least one of the gradient magnetic field coil and a correction coil included in the magnetic resonance imaging apparatus, the method comprising:
- executing a first pulse sequence that applies a first test gradient magnetic field for measuring the primary error magnetic field generated by the application of the first test gradient magnetic field;
- calculating and storing, as primary compensation parameters, an amplitude and a time constant of the primary error magnetic field using the primary error magnetic field;
- executing a second pulse sequence that applies a second test gradient magnetic field for measuring the secondary error magnetic field, in which a waveform obtained by applying the primary compensation parameters to a response waveform of the first test gradient magnetic field is set as a response waveform, and measuring the secondary error magnetic field generated by the application of the second test gradient magnetic field;
- calculating and storing, as secondary compensation parameters, an amplitude and a time constant of the secondary error magnetic field;
- superimposing both the primary correction magnetic field output and the secondary correction magnetic field output to be sent as feedback to the primary correction magnetic field output calculation unit, and supplying a last superimposed output after the feedback as a gradient magnetic field output to the gradient magnetic field coil; and
- superimposing both the primary correction magnetic field output and the secondary correction magnetic field output, without feedbacking to the primary correction magnetic field output calculation unit, as a correction coil output, and supplying to the correction coil.

11. The method of compensating for an error magnetic field according to claim 10, wherein:
- the second pulse sequence for measuring the secondary error magnetic field is a pulse sequence that does not include phase encoding, measures a polarization component of the secondary error magnetic field, and calculates the secondary compensation parameters for the polarization component, and
- in an execution of the pulse sequence, the secondary correction magnetic field output calculated from the secondary compensation parameters for the polarization component is applied to the correction coil.

12. The method of compensating for an error magnetic field according to claim 10, wherein:
- the calculating of the secondary compensation parameters includes
- repeating, while changing values of a set of secondary error magnetic field compensation parameters, the setting, as an input waveform, the waveform obtained by applying the primary compensation parameters to the response waveform of the first test gradient magnetic field and applying the set of secondary error magnetic field compensation parameters to the input waveform to obtain an output waveform, and
- determining, as the secondary compensation parameters, values of the set of secondary error magnetic field compensation parameters at which the output waveform best matches measured values of the secondary error magnetic field obtained in the measuring of the secondary error magnetic field.

* * * * *